United States Patent [19]

Kim et al.

[11] Patent Number: 5,472,889
[45] Date of Patent: Dec. 5, 1995

[54] METHOD OF MANUFACTURING LARGE-SIZED THIN FILM TRANSISTOR LIQUID CRYSTAL DISPLAY PANEL

[75] Inventors: Dong G. Kim; Chul S. Park; Sin C. Park; Hyung M. Park; Gyeong L. Park, all of, Daejeon-shi, Rep. of Korea

[73] Assignee: Korea Electronics and Telecommunications Research Institute, Rep. of Korea

[21] Appl. No.: 903,609

[22] Filed: Jun. 24, 1992

[30] Foreign Application Priority Data

Jun. 24, 1991 [KR] Rep. of Korea .................. 91-10538

[51] Int. Cl.$^6$ .................................................. H01L 21/84
[52] U.S. Cl. .......................... 437/40; 437/51; 437/187; 359/59
[58] Field of Search ........................ 437/40, 41, 101, 437/230, 909, 51, 187; 359/57, 59, 53, 87, 88

[56] References Cited

U.S. PATENT DOCUMENTS

| | | | |
|---|---|---|---|
| 4,832,457 | 5/1989 | Saitoh et al. ...................... | 350/334 |
| 4,990,460 | 2/1991 | Moriyama ......................... | 437/40 |
| 5,206,749 | 4/1993 | Zavracky et al. ................. | 359/59 |
| 5,274,602 | 12/1993 | Glenn ............................... | 365/239 |
| 5,281,450 | 1/1994 | Yaniv ................................ | 427/530 |

FOREIGN PATENT DOCUMENTS 61-214443A 9/1986 Japan.

*Primary Examiner*—Mary Wilczewski
*Assistant Examiner*—Richard A. Booth
*Attorney, Agent, or Firm*—Evenson, McKeown Edwards & Lenahan

[57] ABSTRACT

A method of manufacturing a large-sized thin film transistor liquid crystal display panel in which a plurality of unit thin film transistor liquid crystal display panels are fabricated having a predetermined size on a polyimide substrate. A predetermined number of the unit thin film transistor liquid crystal display panels are arranged in a form of a matrix. The unit thin film transistor liquid crystal display panels are bonded or tiled by using an epoxy resin on a glass substrate to achieved the large-sized thin film transistor liquid crystal display panel. The interface between the unit thin film transistor liquid crystal display panels are filled up with polyimide. Gate bus lines and drain bus lines of the unit thin film transistor liquid crystal display panels arranged in the form of the matrix are electrically connected.

2 Claims, 6 Drawing Sheets

METHOD OF MANUFACTURING LARGE-SIZED THIN FILM TRANSISTOR LIQUID CRYSTAL DISPLAY PANEL

BACKGROUND OF THE INVENTION

1. Field of the Invention

The present invention relates to a method of manufacturing a large-sized thin film transistor liquid crystal display panel and, more particularly, a method of manufacturing a thin film transistor as an unit transistor panel and a large-sized thin film transistor liquid crystal display (TFT LCD) panel using a predetermined number of the unit transistor panels.

2. Description of the Prior Art

In accordance with a conventional method of manufacturing a liquid crystal display (LCD) panel, a step of wiring gate and drain bus lines onto a single substrate is executed in a direction perpendicular to that of a thin film transistor (TFT) forming step in a semiconductor manufacturing process so that the thin film transistors having a so-called "inverted-staggered" structure are electrically connected with each other in a form of an array.

With such a method of manufacturing the thin film transistor LCD panel, each step of forming metal films, semiconductor layers, insulating layers and the like comprising the transistor panel is needed to form fine patterns having a size of serveral thousand Å. In this connection, when aluminum (Al) is used to form the gate electrode and gate wire, a short-circuit is likely to occur on the gate insulating film or between the perpendicularly intersected gate wires. Thus, inferior quality in manufacturing the panel is greatly increased and, hence, a yield of the product to be manufactured is considerably decreased to thereby raise cost of production.

Even if Al is used as a metal material for forming the gate of the transistor, the gate metal is positively oxidized in order to reduce a gate delay time due to Al having a low resistance, and the positively oxidized Al oxide ($Al_2O_3$) is provided to form a stacked insulating layer along with a silicon nitride ($SiN_x$). As a result, it is possible to improve a yield of a large-sized thin film transistor liquid crystal display panel.

Nevertheless, since the Al gate metal exhibits a generally high resisrance, there is a problem in that a high definition picture is not achieved owing to the gate transfer delay when the large-sized thin film transistor panel is fabricated in a size of 40 inches or more.

Further, when the several large-sized panels having a size of 40 inches or more are integrated on a single glass substrate, a limited yield results.

Therefore, in the method of manufacturing the conventional thin film transistor liquid crystal display panel, it should be understood that when the large panel is fabricated, the resistance of gate bus line is likely to be increased and a yield in manufacturing the panel is abruptly decreased due to a defect in the line.

SUMMARY OF THE INVENTION

Accordingly, an object of the invention is to provide a method of manufacturing a large-sized thin film transistor liquid crystal display (TFT LCD) panel in which a gate transfer delay due to a high resistance of gate lines in the panel is reduced and a short-circuit occurring between lines in a thin film transistor manufacturing process is prevented, thereby an improved yield of the large-sized LCD panel results.

In order to achieve the above objective, according to an aspect of the present invention, a three-layer Cr/Cu/Cr gate metal is formed to reduce the resistance of the gate bus line and a short-circuit occurring on the gate insulating films or between wire intersections is minimized by forming the thin film transistor and the gate and drain bus lines onto the upper and lower surfaces of a polyimide substrate respectively, and connecting drain pads and the drain bus lines by way of a via-hole forming process.

Further, because the thin film transistor panel is formed in a periodically repeated array pattern, a transistor panel which is referred to as an unit panel is provided on the polyimide substrate having a size of 5–15 inches and exhibiting a high yield, and a predetermined number of the unit panels are connected to each other on a glass substrate in a form of a matrix. Drain and gate bus lines positioned at an edge of each of the unit panels to be connected with each other are electrically connected by way of an ink jet process so as to multiplicatively extend a size of the panel, thereby preventing the yield of the product from being decreased owing to a large size of the panel.

The above and other objects, features and advantages will be apparent from the following description taken with reference to the accompanying drawings.

DETAILED DESCRIPTION OF THE PREFERRED EMBODIMENT

Now, a preferred embodiment of the present invention will be described below in detail.

Figure 1:
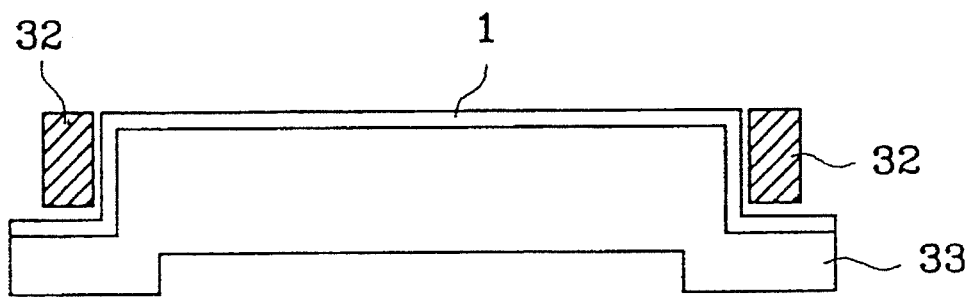
FIG. 1 is a cross sectional view of a polyimide fixture employed for a preferred embodiment according to the present invention.

Referring to FIG. 1, there is shown a cross sectional view of a polyimide fixture employed in the present invention. Preferably, the polyimide fixture comprises an O-shaped ring 32 made of a material such as Teflon having a rectangular section and a polyimide film fixture member 33 of a soft hat-shape having a diameter of 5–15 inches. The O-shaped ring 32 is used for adequately and closely contacting a polyimide film to the fixture before deposition of a gate metal.

The fixture 1 is designed so that it is set on a vacuum chuck of a spinner (not shown) in a metal depositing process and a photoresist process while it is set on a stepper in a photolithography process.

FIGS. 2(A) to 2(I) show sequential processes of manufacturing the TFT LCD panel embodying the present invention.

Now, a method of a large-sized TFT LCD according to the present invention will be described with reference to FIGS. 2(A) to 2(I).

FIRST PROCESS

Figure 2A:
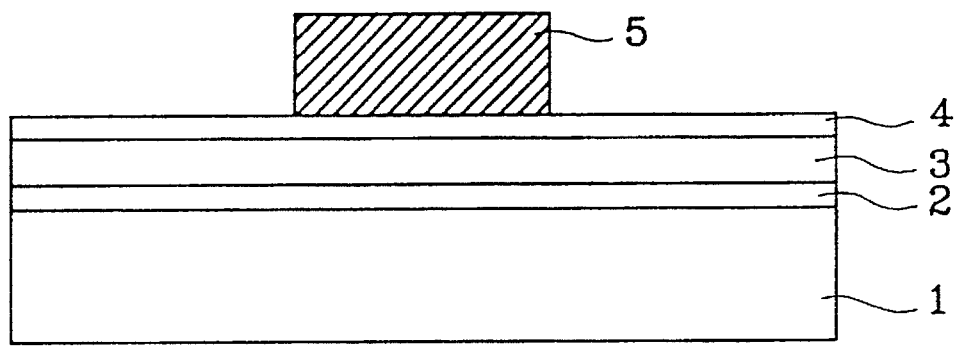
FIG. 2(A) to 2(I) are cross sectional views illustrating steps of manufacturing processes of a TFT LCD transistor embodying the present invention.

Firstly, FIG. 2(A) shows a gate electrode and gate bus line forming process after depositing a three-layer gate metal. More particularly, in order to form the gate electrode and gate bus line, a first chrome (Cr) thin film 2 having a thickness of 100–200 Å is deposited on the polyimide substrate 1 by a DC sputtering method. A copper (Cu) thin film 3 having a thickness of 1000–2000 Å is deposited on the Cr thin film 2, and a second Cr thin film 4 having a thickness of 100–200 Å is sequentially deposited on the Cu thin film 3.

Preferably, according to the present invention the polyimide film is used as a substrate material because it has good heat-resistance and transparency and is advatageous to a process of connecting a predetermined number of unit thin film transistors to be executed later. The polyimide film is commercially obtainable as a trademark "Kapton film" or "Uplex film" made by Dupont Co., Ltd.

The first Cr thin film 2 serves to enhance an adherence strength between the polyimide substrate 1, and the Cu thin film 3 and the Cu thin film 3 has a lower gate pulse transfer delay in comparison with Al conventionally used as the gate metal by one half to thereby reduce the gate transfer delay.

Moreover, the second Cr thin film 4 functions as a barrier for preventing counteraction between the Cr thin film 3 and a silicon nitride layer serving as a gate insulating layer so as to define a stabilized interface between the Cu thin film 3 and the silicon nitride layer. As a result, a line defect owing to hillock or the like can be greatly reduced in comparison with the use of Al as the gate metal whereby a yield in manufacturing the panel is improved considerably.

Figure 2B:
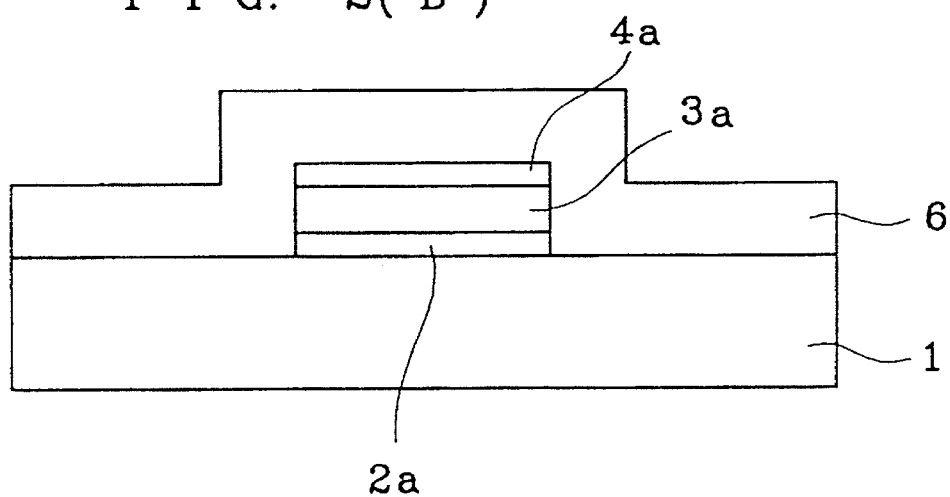

After depositing the three-layer gate metals, a photoresist 5 is deposited on a portion of the second Cr thin film 4, and then the first and second Cr thin films 2 and 4 and the Cu thin film 3 are sequentially etched by using the photoresist 5 as a mask to define a gate area having a three-layer structure 2a, 3a and 4a (see FIG. 2(B)) for forming a gate electrode. At this time, a KMnOH: NaOH (1:1) solution can be used as an etchant for etching the Cr thin films 2 and 4, while a $FeCl_3$-30% solution can be employed as an etchant for etching the Cu thin film 3.

SECOND PROCESS

FIG. 2(B) shows a process of depositing a gate insulating layer. In this process, silicon nitride ($SiN_x$) is deposited in thickness of approximately 3000 Å over an entire surface of a resultant structure of the first process by way of a PECVD method so as to form the gate insulating layer 6 as shown in FIG. 2(B).

THIRD PROCESS

Figure 2C:
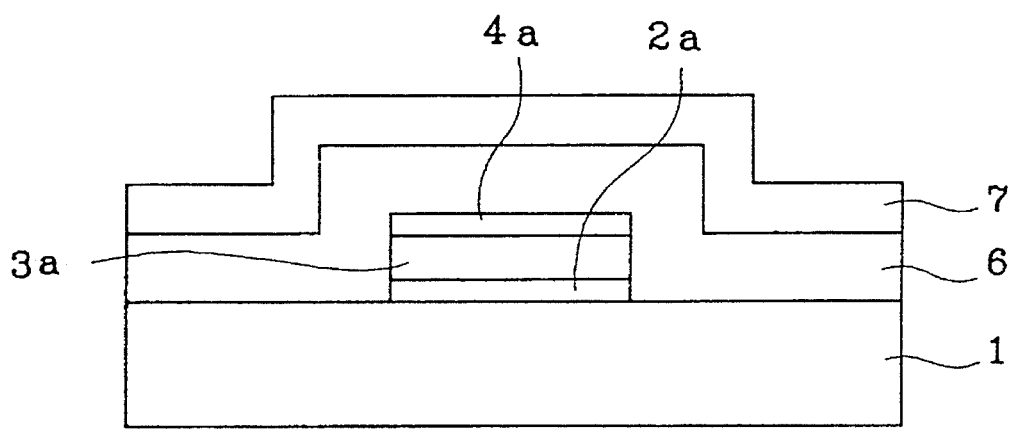

FIG. 2(C) shows a process of forming a semiconductor layer. That is, an amorphous silicon having a thickness of 1200–1500 Å is deposited over an entire surface of the gate insulating layer 6 by way of a PECVD method to form a semiconductor layer 7.

FOURTH PROCESS

Figure 2D:
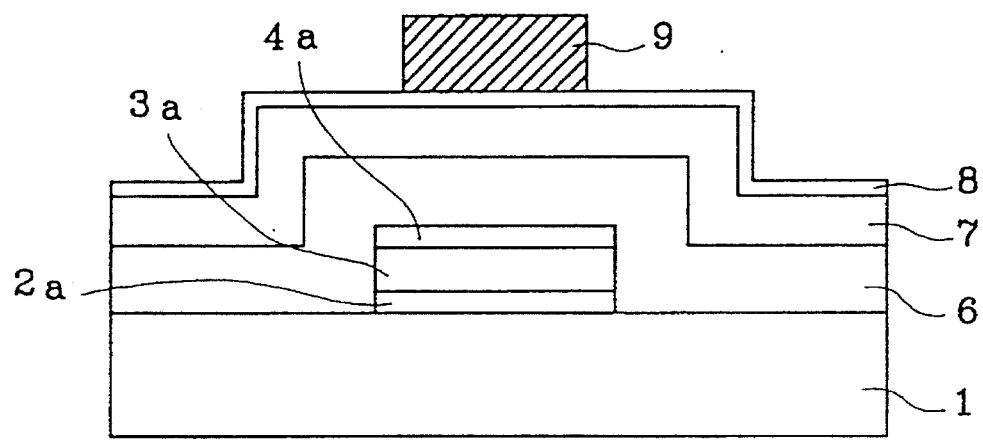

FIG. 2(D) shows a process of forming an etching stopper. Firstly, an amorphous silicon nitride 8 having a thickness of approximately 300 Å is deposited on the semiconductor layer 7 by using a PECVD method in order to prevent the semiconductor layer from being damaged in a $n^+$ layer etching process which will be performed later.

Next, a photoresist 9 is formed on the amorphous silicon nitride layer 8 and a dry etching is then carried out to etch the silicon nitride layer 8 by using the photoresist 9 as a mask to obtain a remaining area 8a so as to define source and drain forming areas. The etching gas used is preferably employed with $CF_4+O_2$.

FIFTH PROCESS

Figure 2E:
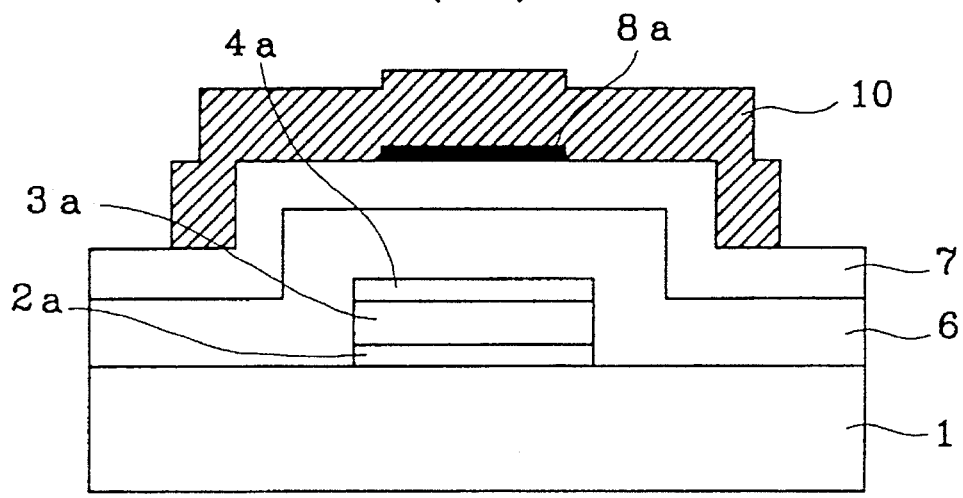

FIG. 2(E) illustrates a channel layer forming process. More particularly, the semiconductor layer 7 is etched by way of a dry etching method using the photoresist 10, patterned on the semiconductor layer 7, as a mask so as to form a channel layer 7a (see FIG. 2(F)). In this case, $CF_4+O_2$ can be preferably used as the etching gas.

SIXTH PROCESS

Figure 2F:
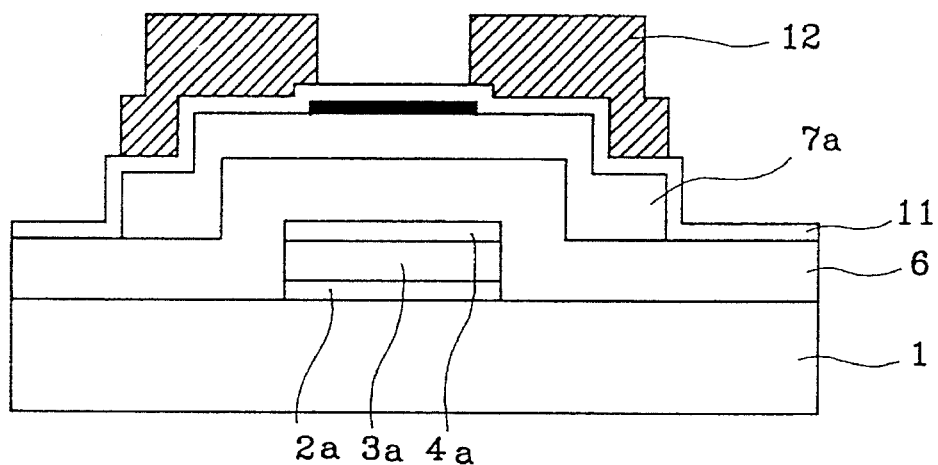

FIG. 2(F) shows an ohmic contact forming process, wherein a $n^+$ layer 11 is deposited over an entire surface of a resultant structure including the channel layer 7a and an etching is executed between the source and drain areas so as to ensure the ohmic contact of the source and drain areas. That is, the $n^+$ layer 11 having a thickness of approximately 300 Å is deposited on the entire surface including the channel layer 7a obtained in the fifth process by way of a PECVD method and an area between the source and drain areas is etched by a dry etching method using a photoresist 12, patterned on the $n^+$ layer 11, as a mask. The etching gas used is preferably employed with $CF_4+O_2$.

SEVENTH PROCESS

Figure 2G:
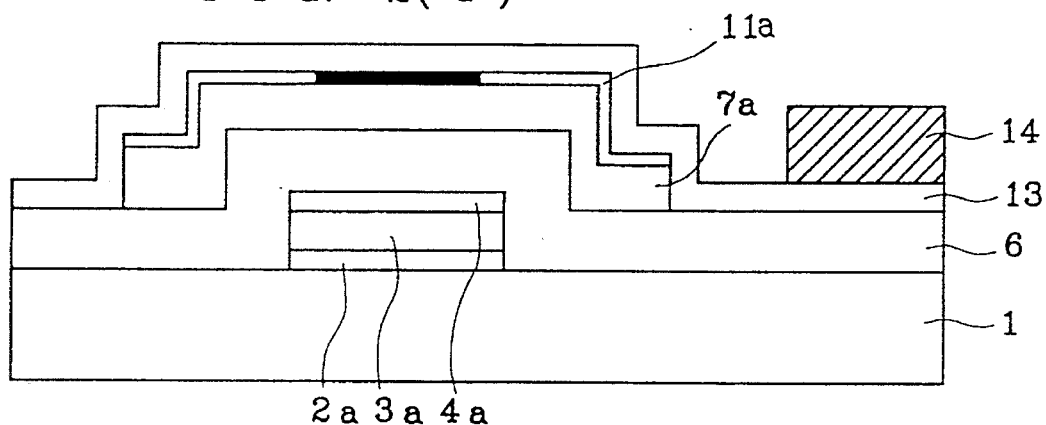

FIG. 2(G) illustrates an Indium Tin Oxide (ITO) forming process, which referred to as a transparent electrode. Firstly, the ITO layer having a thickness of 1500–2000 Å is deposited on an entire surface obtained in the sixth process by a sputtering method. Sequentially, a photoresist 14 is patterned on the ITO layer to define a transparent electrode area and the ITO layer is then etched by a dry etching method using the photoresist 14 as a mask to form the transparent electrode 13. At this time, $CH_2OH+HNO_3$ is preferably used as an etching gas.

EIGHTH PROCESSS

Figure 2H:
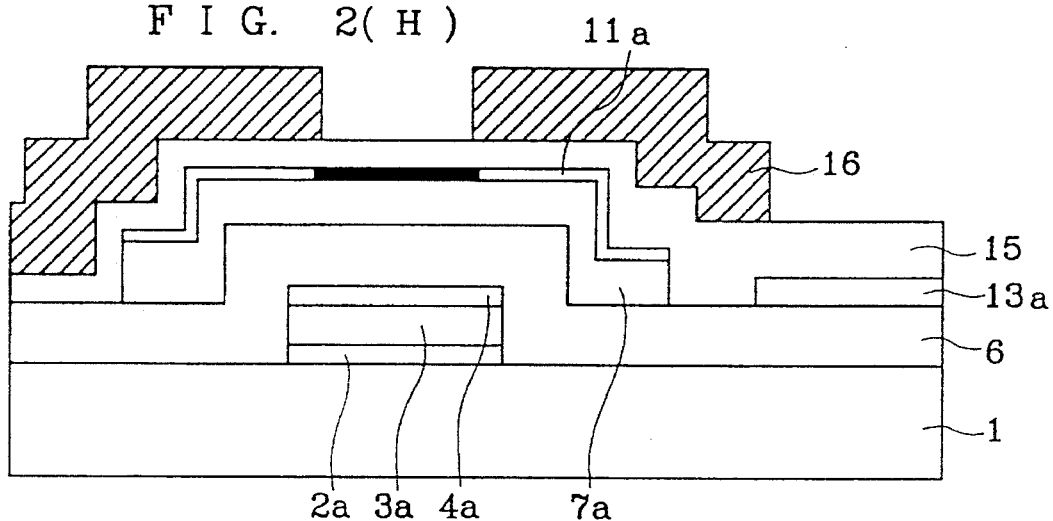

Referring to FIG. 2(H), there is illustrated a source and drain electrod forming process. On the entire surface etched in the seventh process, an Al thin film 15 having a thickness of 3000–5000 Å is deposited by way of a sputtering method. Consequently, a photoresist 16 is patterned on the Al thin film 15 and an etching process is carried out by using the photoresist 16 as an etching mask so as to define the source and drain electrodes. In this case, $H_3PO_4+HNO_3$ can be preferably used as an etchant in the etching process.

NINTH PROCESS

Figure 5:
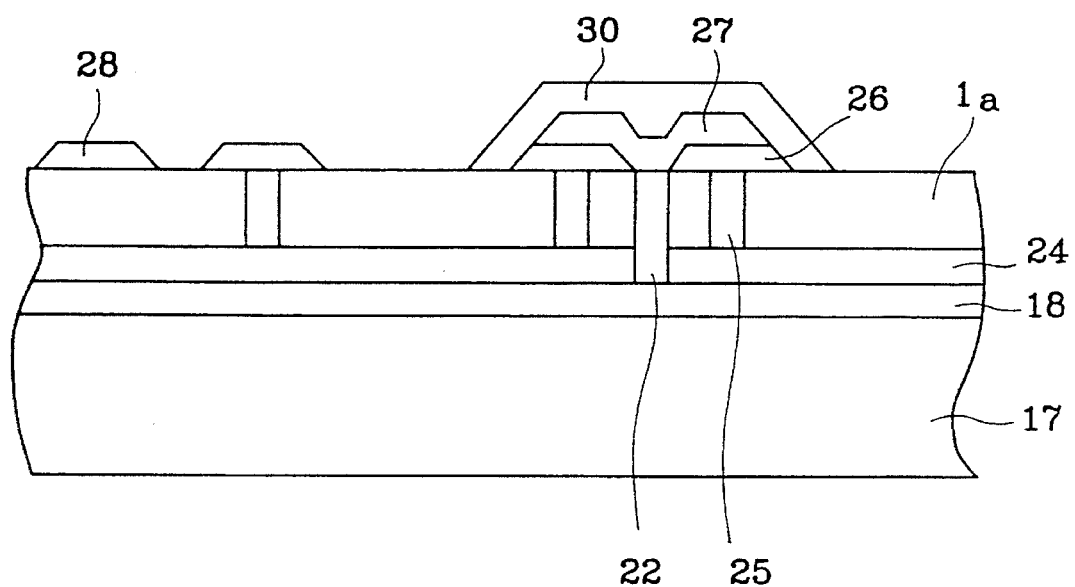
FIG. 5 is a cross sectional view showing a drain wicing process according to the present invention.

Subsequently, on all of the drain pad, designated by referece 26 in FIG. 5, of the thin film transistors formed as described above, a via hole forming process is carried out by using a RIE method so that a via hole, generally designated at 25 in FIG. 5, is reached to the bottom surface of the drain pad 26 through the polyimide substrate 1. Consequently, the via hole 25 is filled up with copper component by way of an electroless plating method. Further, a drain bus line made of hl, generally designated at 24, is defined in thickness of 3000–5000 Å on the bottom surface of the polyimide substrate 1 so as to connect the adjacent thin film transistors with each other. A diameter of the via hole 25 is set to 25–50 μm.

TENTH PROCESS

Figure 2I:
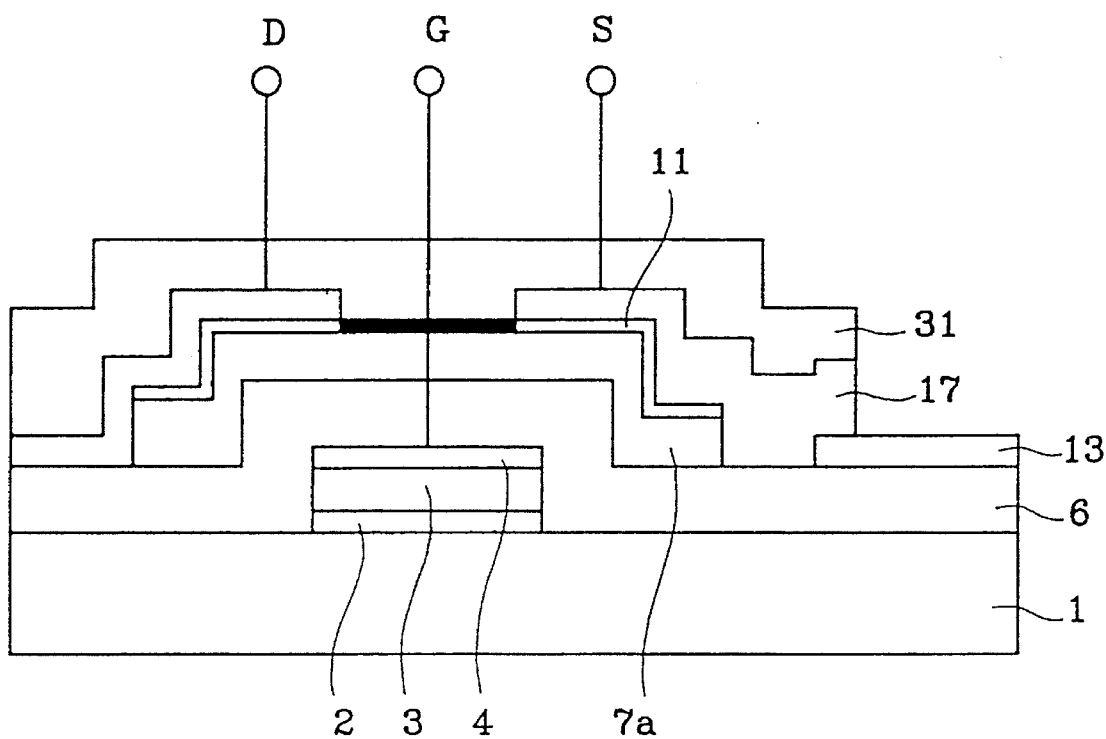

As shown in FIG. 2(I), an amorphous silicon nitride having a thickness of approximately 5000 Å is deposited over an entire surface obtained by the above-mentioned processes to form a passivation film 31 for assuring a passivation of the entire surface to thereby complete the thin film transistor.

ELEVENTH PROCESS

Figure 3:
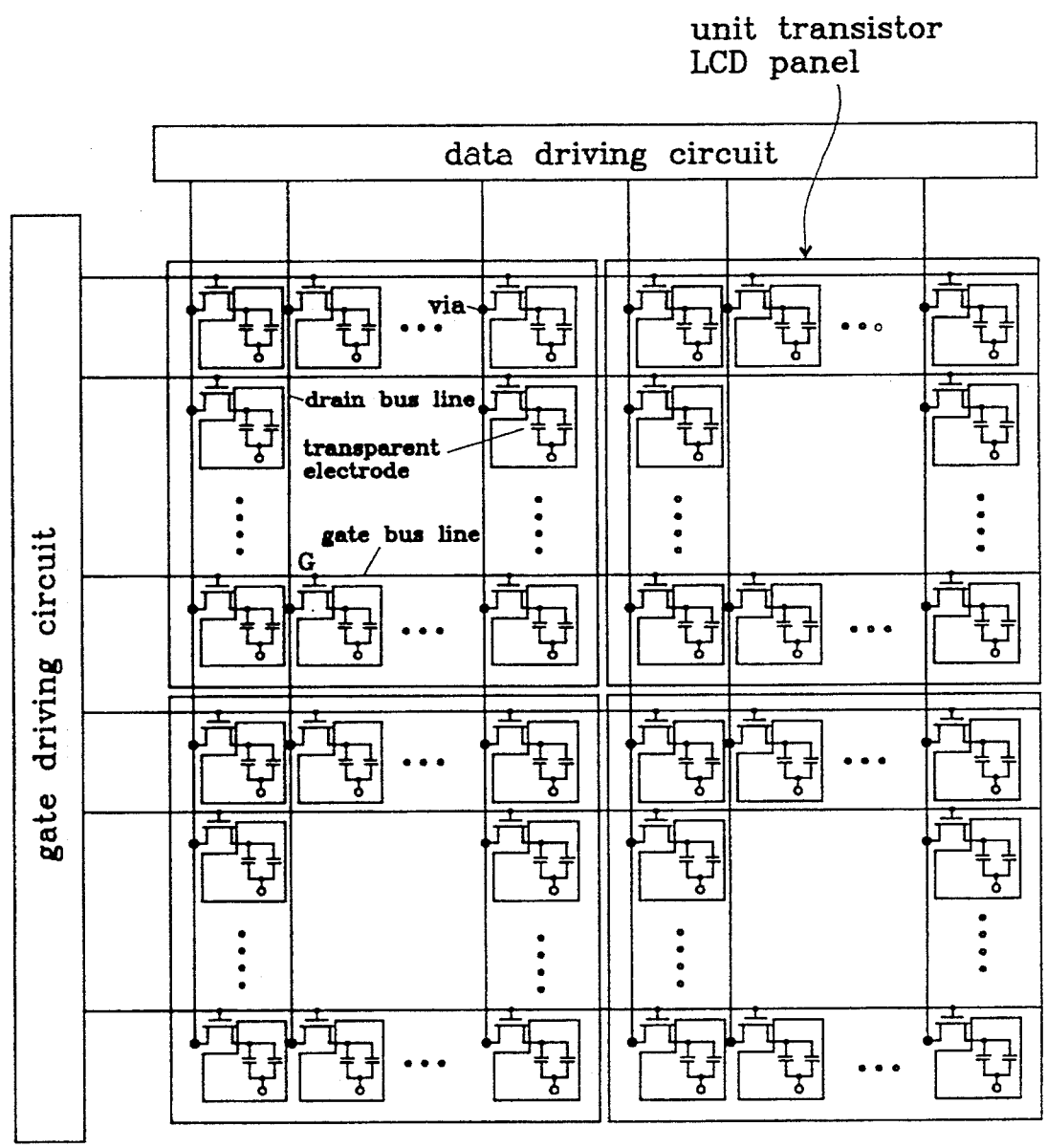
FIG. 3 is a schematic view of a large-sized liquid crystal display panel including four unit thin film transistor panels fabricated according to the present invention.

After forming the passivation film 31, the unit panel is cut out in desired size so as to arrange a predetermined number of the transistor panels. More particularly, as shown in FIG. 3, a predetermined number of, for example, four unit TFT LCD panels, each having a size of 5–15 inches are arranged and fixed in a form of a matrix, and the gate and drain bus lines of the transistors are electrically connected with each other by way of an ink jet method so as to obtain a multiplicatively elongated TFT LCD panel having a size of 10–30 inches. Therefore, if the 4×4 unit panels arranged in row and column directions are connected with each other, then it is possible to fabricate the large-sized TFT LCD having a size of 20–60 inches.

TWELFTH PROCESS

Figure 4:
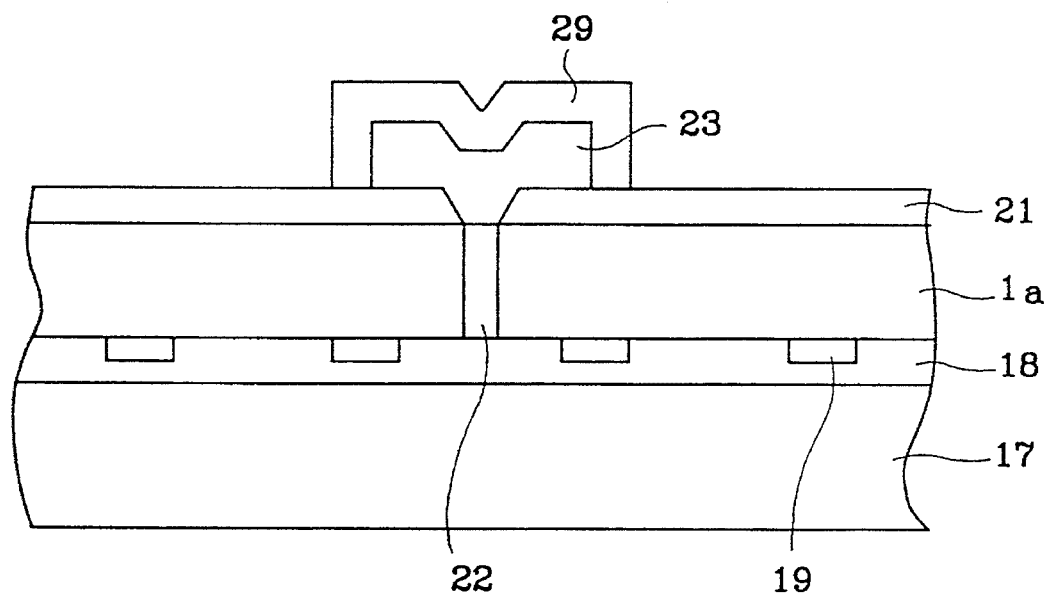
FIG. 4 is a cross sectional view showing a gate wiring process according to the present invention.

Referring to FIG. 4, the unit panels are arranged on a glass substrate 17 and then fixed by using a material such as epoxy generally designated at 18 so as to connect them on the substrate 17. At this time, spaces defined by the interfaces of the unit panels are flattenly filled tip with a material such as polyimide by way of an ink jet method without using any mask, the polyimide being filled up in a width of 10–50 μm.

THIRTEENTH PROCESS

The passivation film positioned at edges sf the unit panels to be connected with each other is removed during a process of wiring gate bus line 21 so as to expose the gate bus line 21. Then, the exposed gate bus line 21 is connected to an adjacent gate bus line (not shown) by way of an ink jet method. Preferably Cu can be employed as the wiring metal and the width of the wiring metal is set to 10–30 μm.

An additional passivation film 29 made of polyimide is deposited over an entire surface after wiring between the gate bus lines. At this case, a width of the wiring metal is set to 20–60 μm.

FOURTEENTH PROCESS

FIG. 5 illustrates a process of wiring between the drain bus lines 24. More specifically, the passivation film positioned at the edges of the unit panels to be connected is exposed in order to expose the drain bus lines 24. Consequently, the exposed drain bus line 24 is connected to an adjacent drain bus line (not shown) by using an ink jet method. At this time, a condition of the process is similar to that of the wiring process executed between the gate bus lines.

As described above, according to the present invention, the thin film transistor is provided on the tipper and lower surfaces of the transparent polyimide substrate, and the drain bus lines connected to the drain pads by way of the via hole forming method are formed on the lower surface of the polyimide substrate while the gate bus lines are formed on the upper surface of the substrate. As a result, the problem of the short circuit occuring on the conventional liquid display panel is avoided. In addition, since the three-layer gate metal film is provided on the panel, the gate transfer delay may be sufficiently minimized. Furthermore, the unit thin film transistor panels having a size of 5–15 inches, fabricated with a higher yield, are arranged and fixed in matrix on the glass substrate, and the drain and gate bus lines positioned at the edges of the unit panels are electrically connected by way of an ink jet method. Thus, it is possible to fabricate the large-sized liquid crystal display panel having a size of 20–60 inches while ensuring the same yield as that of the small-sized panel having a size of 5–15 inches.

Although, the present invention has been described with respect to the preferred embodiment, it will be understood that various changes and modifications may be made therein without departing from the spirit and scope of the invention.

What is claimed is:

1. A method of manufacturing a large-sized thin film transistor liquid crystal display panel, the method comprising the steps of:

preparing a plurality of large-sized thin film transistor liquid crystal display panels arranged in a form of a matrix on a glass substrate, each of the panels having a plurality of thin film transistors formed on a polyimide substrate, each of the transistors having a three-layer gate structure including a first Cr thin film formed on the polyimide substrate, a Cu thin film formed on the first Cr thin film and a second Cr thin film formed on the Cu thin film;

bonding said thin film transistor liquid crystal display panels arranged thus to the glass substrate by using epoxy resin to achieve the large-sized thin film transistor liquid crystal display panel;

filling up an interface between the large-sized thin film transistor liquid crystal panels with polyimide; and electrically connecting respective drain bus lines and gate bus lines of said large-sized thin film transistor liquid crystal display panels arranged in the matrix form by metallization using Cu thin film having a width of 10–30 μm, the respective drain bus lines being connected electrically to respective drain bus lines of adjacent large-sized thin film transistor panel through via holes in the polyimide substrate, and each of the via holes being filled up with Cu material to achieve electrical connection between the large-sized thin film transistor liquid crystal display panels.

2. The method according to claim 1, wherein the step of filling, up the interface between the large-sized thin film transistor liquid display panels is performed with polyimide using an ink jet method without using any mask to make the entire surface flattened, the polyimide being filled to a dimesion of 10–15 μm.

* * * * *